United States Patent [19]

Lile et al.

[11] 4,051,437
[45] Sept. 27, 1977

[54] METHOD AND APPARATUS FOR SEMICONDUCTOR PROFILING USING AN OPTICAL PROBE

[75] Inventors: Derek L. Lile; Neil M. Davis, both of San Diego, Calif.

[73] Assignee: The United States of America as represented by the Secretary of the Navy, Washington, D.C.

[21] Appl. No.: 673,223

[22] Filed: Apr. 2, 1976

[51] Int. Cl.² .................................... G01R 31/26
[52] U.S. Cl. ........................... 324/158 R; 324/158 D
[58] Field of Search ............ 324/158 D, 158 T, 73 R, 324/158 R; 29/574

[56] References Cited

U.S. PATENT DOCUMENTS

| 3,039,056 | 6/1962 | Many et al. | 324/158 D |
| 3,549,999 | 12/1970 | Norton | 324/158 D |
| 3,678,384 | 7/1972 | Oatley | 324/73 R |
| 3,745,454 | 7/1973 | Nikirk et al. | 324/158 D |

Primary Examiner—Rudolph V. Rolinec
Assistant Examiner—Ernest F. Karlsen
Attorney, Agent, or Firm—R. S. Sciascia; G. J. Rubens; T. M. Phillips

[57] ABSTRACT

A method and apparatus of determining defects in semiconductors, by scanning with small spot of light. As the semiconductor is scanned, a voltage is generated which may be used to indicate gross defects as well as the reduction in carrier lifetime due to the defects.

10 Claims, 8 Drawing Figures (a)

(b)

METHOD AND APPARATUS FOR SEMICONDUCTOR PROFILING USING AN OPTICAL PROBE

BACKGROUND OF THE INVENTION

The current trend in microelectronic technology of decreasing device size and increasing integrated circuit complexity is placing ever increasing demands on the level of spatial uniformity required of the semiconductor starting material. Inhomogeneities in the semiconductor, present either after slice preparation or introduced during circuit manufacture can lead to unacceptable variations in device characteristics which may manifest themselves as either an initially unacceptable IC chip or perhaps even worse, the subsequent failure of an initially acceptable circuit. A need then exists for some means of semiconductor profiling to enable regions of suspect material to be identified early in the production cycle. Also the technique itself should introduce a minimum of damage into the sample under scrutiny.

SUMMARY OF THE INVENTION

The present invention provides for a method and apparatus for a scan measurement of the photo voltage generated in the space charge region at the surface of a semiconductor. Apparatus is provided for optically scanning with a small spot of light the sample under consideration.

Accordingly, it is an object of the present invention to provide a method and apparatus for the detection of semiconductor inhomogeneities by a scanned measurement of the surface photo voltage generated in the surface space charge region of the semiconductor of interest.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
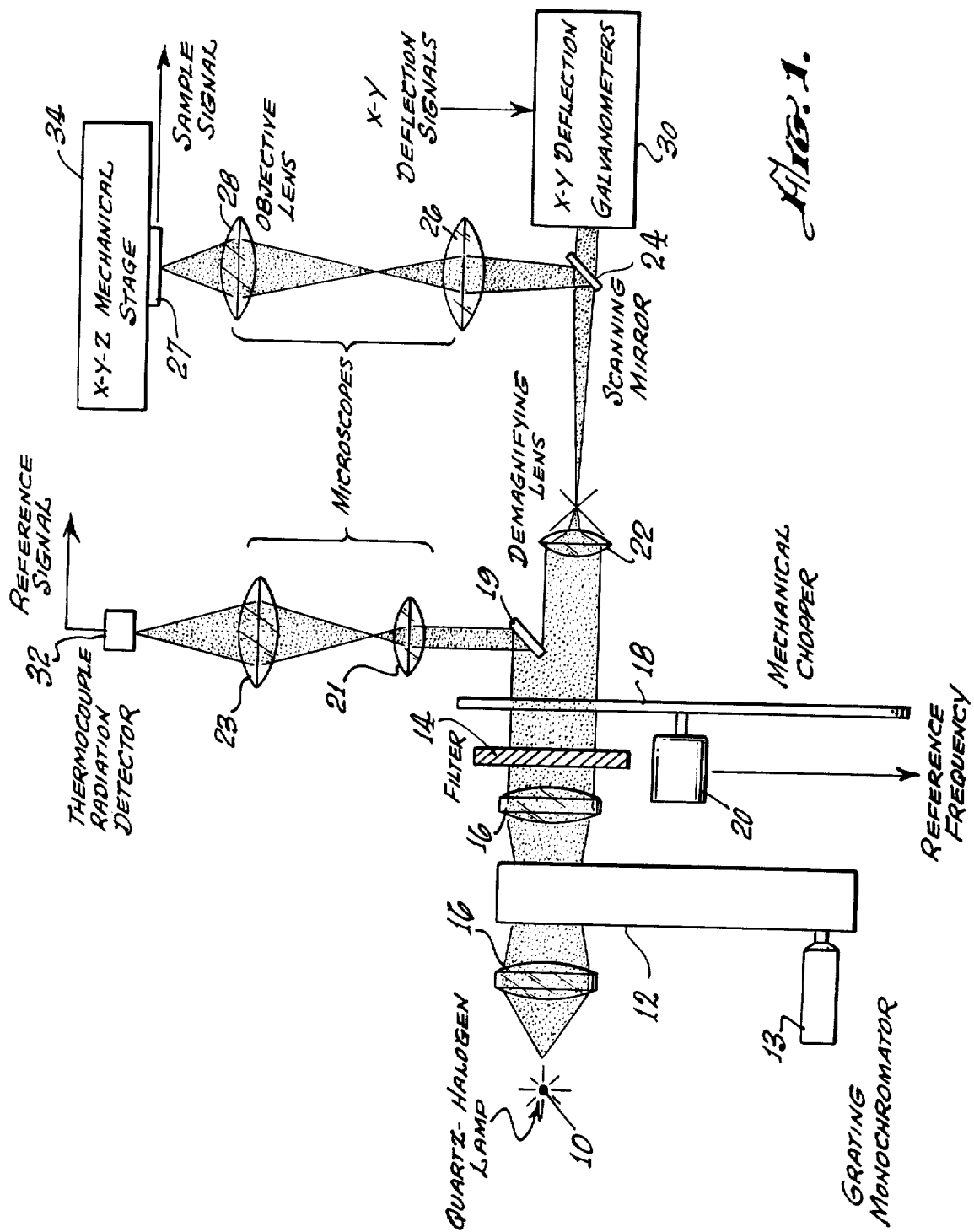
FIG. 1 is a optical diagram of the apparatus.

Referring now to FIG. 1 wherein there is shown a schematic illustration of the optical probe scanner, a variable wavelength monochromatic beam is generated from a broadband Quartz Hallogen source 10 by passing the radiation through a grating monochromator 12, low-pass filter 14 (to remove unwanted defraction orders) and collimator lens 16. Following modulation by a mechanical chopper 18 a portion of the emergent beam is diverted by a small mirror 19 to a thermocouple detector 32 to provide a reference signal. A demagnifying microscope (lenses 21, 23) column is placed in this path to enchance the intensity of the signal from the thermocouple 32 and to balance the attenuation of the glass optics in the main beam. The main beam passes through an intermediate demagnifying microscope object lens 22 onto a scanning mirror 24 which deflects it through approximately 90° into a demagnifying microscope column. The beam spot size at the focus of the microscope objective lens 28 may be varied by changing eithr or both the intermediate lens 22 and objective lens 28. Typical objective lenses used provided a diffraction limited spot size of approximately 5$\mu$m for 1$\mu$m illumination. This large diffraction limit results from using long working distant objective lenses. Spot size may be measured by scanning the spot over a knife edge onto a large area photo detector. The intensity of the spot may be adjusted by varying the voltage to the source 10. Typical maximum intensities into a 100$\mu$m spot where 1$\mu$m watt at 1$\mu$m wavelength.

The spot for exciting the sample (lenses 26, 28) is scanned in a raster pattern by tilting the single scanning mirror 24 about two orthogonal axis. A transducer 30 drive by sawtooth voltages provided the signals for tilting the scanning mirror 24. The maximum frequency of scan is determined by the resonant frequency of the galvonometers 30. In practice typical maximum Y rates were found to be 10Hz while the X deflection movement could be driven to approximately 300Hz. The semiconductor sample 27 is positioned on an X-Y-X mechanical stage 34 for ease of either being scanned in a raster format or being held stationary while the intensity and wavelength are varied.

Figure 2:
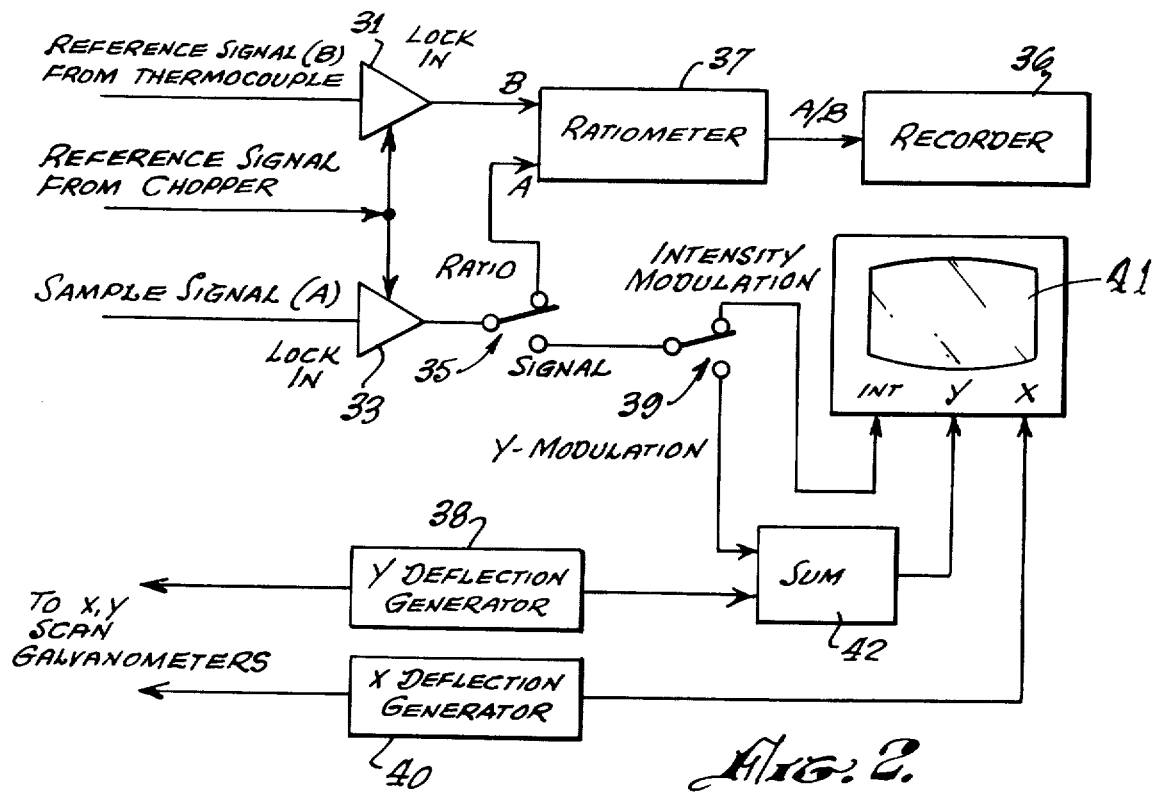
FIG. 2 is a block diagram of the circuit for processing the signal generated by the apparatus of FIG. 1.

Referring now to FIG. 2, the reference signal from thermocouple 32 and the sample signal from sample 27 are fed to phase locked amplifiers 31 and 33, respectively. The reference signal from chopper 18 is also fed to lock in amplifiers 31 and 33.

Lock in amplifier 31, referenced to the mechanical chopper 18 is used to measure the signal from the reference thermocouple 32 and lock in amplifier 33 is used to measure the signal from the sample 27 under study. As shown in FIG. 2, the apparatus may be operated in two distinct modes. In the first mode the beam is held stationary and data taken at various wavelengths at one point on the sample 27. As shown in FIG. 1 sample 27 is mounted on an X-Y-Z micro positioning stage 34 and by observation and visible light through the trinocular head of the microscope it is possible to position the light beam on a particular point on the sample while adjusting the position of the sample for best beam focus. In the second mode, the beam is scanned over the sample at a fixed wavelength. In the second mode the data is displayed on a CRT 41, the beam of which is driven in synchronism with the scanning light beam by means of reference signals from the generators driving the galvonometer movements of scanning mirror 24.

Two forms of display are possible as is illustrated in FIG. 2. In the first the intensity modulated display, the signal from sample 27 is used to Z modulate the CRT beam intensity. In the second form of display a pseudo-topographic display is generated by adding the sample signal to the reference signal in summing circuit 42 to provide the driving signal for Y deflection plates of the CRT 41. For both forms of display retrace blanking was accomplished by gating signals available from the deflection drivers.

In order to measure the surface photo voltage generated it is necessary to make an electrical contact to both the bulk of the sample and to the surface. Ohmic contacts are not necessary. It is only necessary that the contact potential follow the potential of the semiconductor. If the light beam is modulated then capacitively coupled contacts have been found to be satisfactory. Contact to the surface of the sample may be achieved in three ways: (1) a metal evaporated onto the surface of the semiconductor which will sense $\Delta C_s$ directly; (2) an MOS contact may be used to sense the signal capacitively; and (3) the photo voltage has been detected using a suitable electrolyte. In the latter case no permanent contact need be made to the sample being tested.

In operation and by way of example, all the results presented were obtained at ambient room temperature on <100> oriented slices of device grade n-type silicon resistivity in the range 1-3$\Omega$ centimeters. The slices were 500$\mu$m thick with a mirror polish on the front surface and a lightly etched saw-cut finish on the back.

Figure 3:
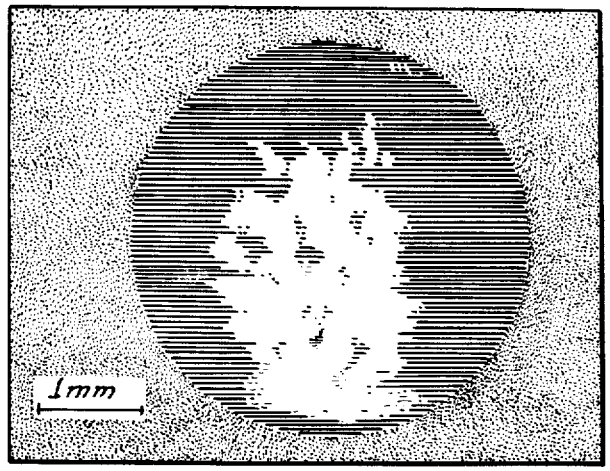
FIG. 3 are cathode ray tube presentations of a scanned photo voltage response in the intensity modulated mode and the Y modulated mode of a circular Si planar p-n function photo diode.
Figure 3:
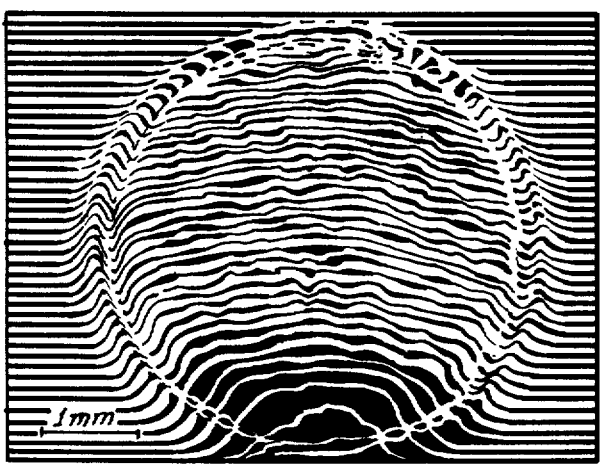

By way of example there is shown in FIG. 3 the photo voltaic response. The photo voltaic responsie iterated by a single line scan of a 10.1$\mu$m diameter light spot across a 400$\mu$m diameter semi-transparent Schottky barrier. The approximately exponential rise of the signal as the spot approaches the electrode as well as the sharp reduction as the spot moves on to the electrode are apparent.

Figure 4:
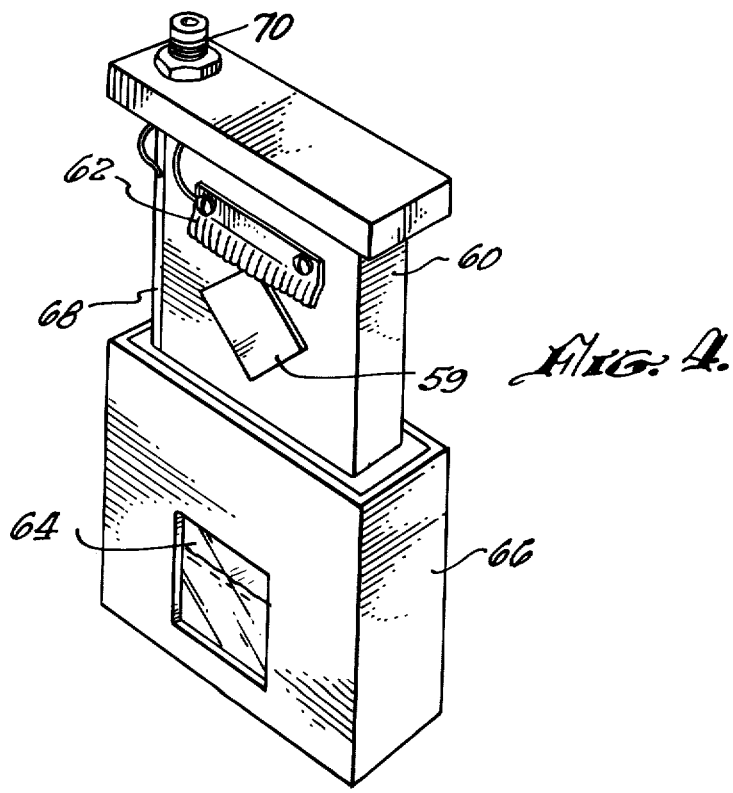
FIG. 4 shows an electrolytic cell for supporting the sample to be scanned.

The electrolytic cell of FIG. 4 is used where the photo voltage is being detected using an electrolyte. The sample 59 is supported at an edge between Delrin (acetal resin) backplate 60 and a phosphor bronze spring finger 62, the spring finger serving as the contact to the sample. The sample 59 and Delrin support 60 are then immersed in the electrolyte 64 contained in a glass cell 66. The distance between the sample surface and the front window of the cell in actual practice was found to be less than 2.00mm. Such a short path into electrolyte is desirable to insure that light absorption is minimized. Also it has been found desirable that an electrolyte of low absorption over the wavelength range of interest should be used. In practicing the present invention the electrolytes used where essentially 100% transmitting over the range 0.8 to 1.2$\mu$m. A platinum reference electrode 68 is attached to the side of the Delrin block 60. The photo voltages generated are measured between the phosphor bronze fingers 62, which should not be immersed in the electrolyte, and the platinum electrode 58. The sample signal is then fed to the phase locked amplifier 33 and the signal processed in the same manner as discussed above.

In practice it was found that 1% by weight aqueous solution of $Na_2So_4$ electrolyte was found to be satisfactory.

Figure 5:
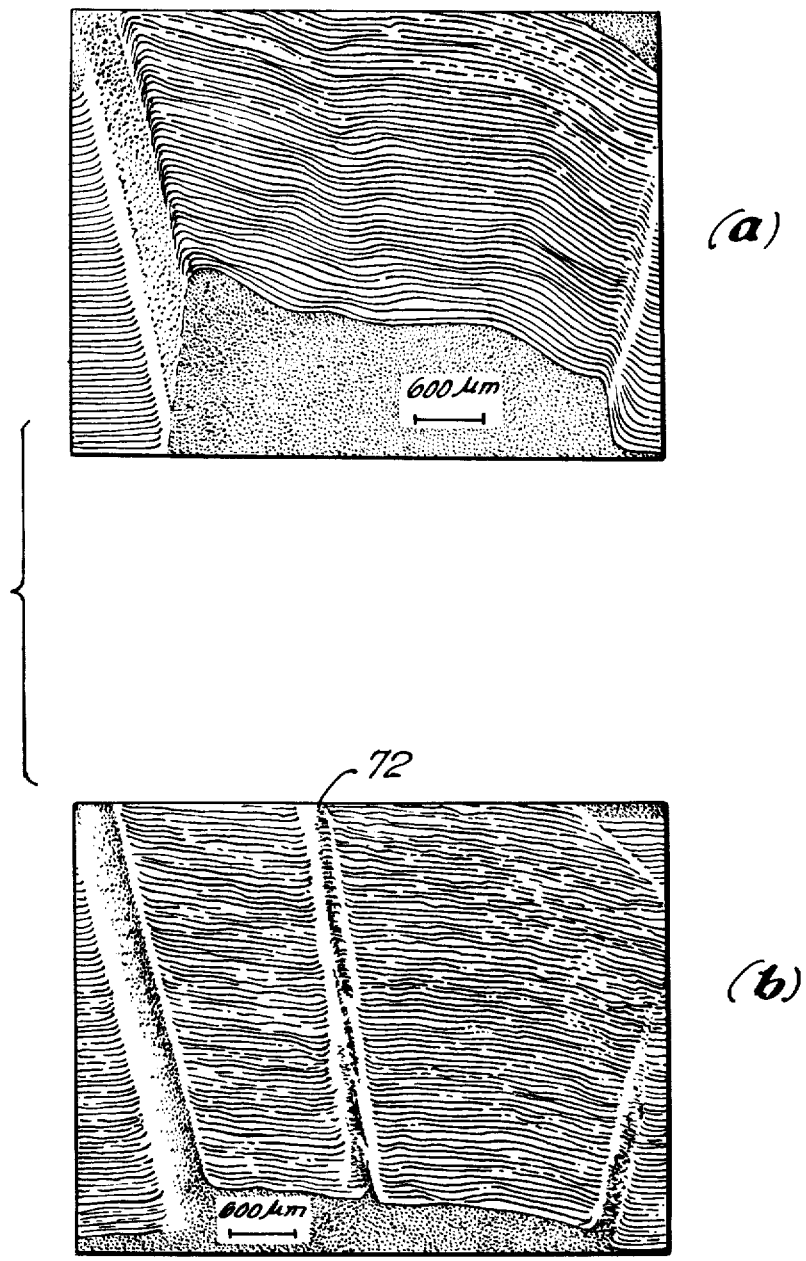
FIG. 5 shows the scanned photo voltage response of the polished front face of a piece of silicon immersed in a $Na_2So_4$ electrolyte.

FIG. 5 shows the scan response at 1.0$\mu$m of a piece of silicon immersed in the electrolytic cell shown in FIG. 1. FIG. 5a shows the scanned response in the intensity node and FIG. 5b shows the scanned response in the X-Y mode. In order to demonstrate the detection of an anomoly in the sample FIG. 5 was removed from the electrolyte and a fine scribe line was drawn across the back of the sample. The sample was then reimmersed in the electrolyte and rescanned as shown in FIG. 5b. It can be seen that the scribed line 72 is clearly visible resulting in a reduced response at the shorter wavelength, consistent with a reduced value of lifetime, and an enhanced response at the longer wavelength.

Figure 6:
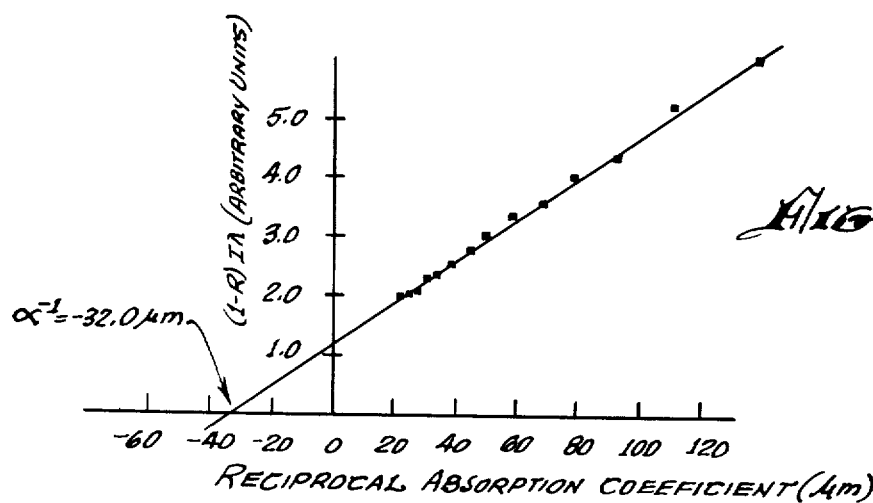
FIG. 6 is a graph showing (1-R)I$\lambda$vs. reciprocal absorption coefficient.

As well as providing a qualitative display of these semiconductor structures it is also possible to make a quantitative measurement of lifetime. FIG. 6 shows the results of a spectral measurement made by positioning the light spot (<10$\mu$m diameter) between the electrodes of a commercially available MOS transistor. As can be seen the measurements of the lifeline and the material are linear and by extrapulation with the line intersects the abscissa at $\alpha^{-1} = -32.0\alpha m$.

Figure 7:
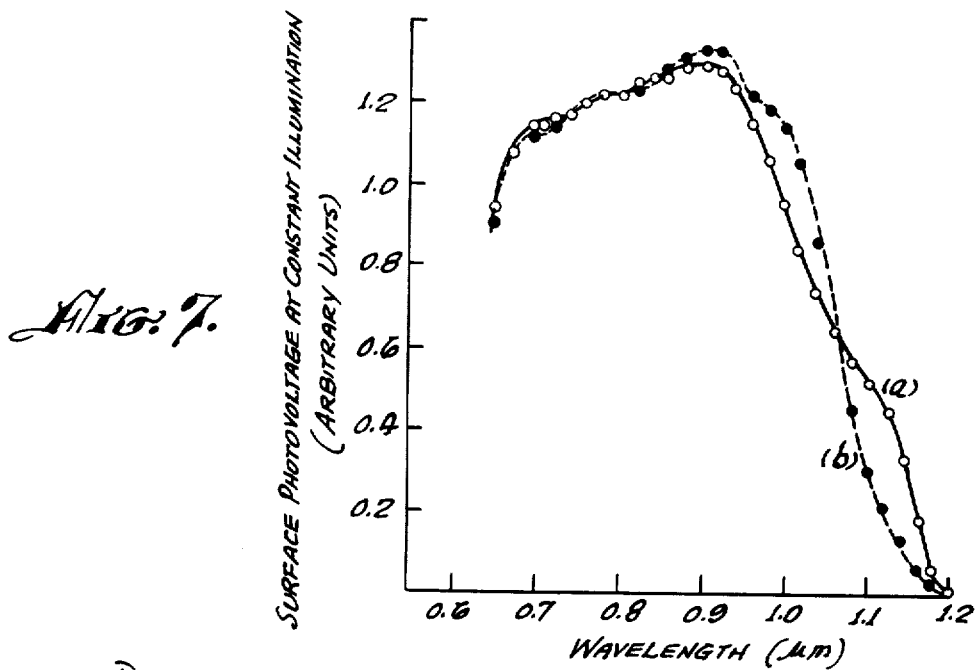
FIG. 7 is a graph showing the surface photo voltage at constant illumination.
Figure 8:
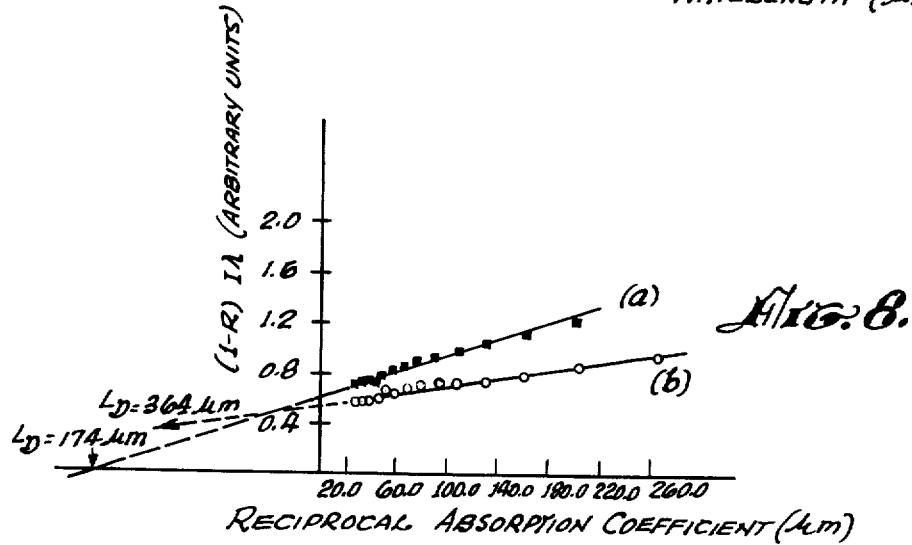
FIG. 8 is a graph showing (1-R)I$\lambda$vs. reciprocal absorption coefficient.

Spectral runs were made with the light spot stationary over the scribe line and also over the defect region of the sample shown in FIG. 5. The results are shown in FIG. 7. Plotted so as to determine diffusion length, the results appear as in FIG. 8. It can be seen that the damage introduced by scratching the back of the slice has resulted, in the region of the scratch, in a decrease in the diffusion length of the sample by a factor of approximately 2.

Obviously many modifications and variations of the present invention are possible in the light of the above teachings. It is therefore to be understood that within the scope of the appended claims the invention may be practiced otherwise than as specifically described.

What is claimed is:
1. A method of semiconductor profiling, the steps of
   a. forming a light beam having a diameter of less than 100$\mu$m,
   b. positioning a semiconductor sample of the type which generates a signal voltage in response to optical excitation in an electrolytic solution,
   c. scanning said light beams over said sample in a raster format;
   d. utilizing the signal voltages generated by said sample in response to being scanned by said light beam to determine the presence of anomalities in said sample.
2. The method of claim 1 further comprising the step of quantizing the generated signals for use in determining the recombination lifetime of carriers in the semiconductor sample.
3. The method of claim 1 further comprising the step of graphically displaying the generated signals to visually observe any anomalies that may be present in said semiconductor sample.
4. An apparatus for profiling semiconductors to determine their homogeneity comprising:
   a. means for holding the semiconductor sample of interest in an electrolytic solution,
   b. a light beam source having a diameter of less than 100$\mu$m,
   c. electro-optical deflection means for focusing and causing said light beam to scan said sample in a raster format;
   d. signal processing circuit means coupled to said sample for providing output signals proportional to the homogeneity profile of said sample.
5. The apparatus of claim 4 wherein said electrolytic means includes a container sufficiently filled with an electrolyte in which said sample can be submerged, said container having a transparent area through which said light beam may pass to scan said sample.
6. The apparatus of claim 4 wherein said signal processing means provides output signals for graphically displaying the homogeneity profile.

7. The apparatus of claim 4 wherein said signal processing means provides quantitative output signals for determining the recombination lifetime of the carriers in said semiconductor.

8. The apparatus of claim 4 wherein the electrolyte of said electrolytic means is 1% by weight aqueous solution of $Na_2SO_4$.

9. The apparatus of claim 5 wherein said signal processing means provides output signals for graphically displaying the homogeneity profile.

10. The apparatus of claim 9 wherein said signal processing means provides quantitative output signals for determining the recombination lifetime of the carriers in said semiconductor.

* * * * *